(12) United States Patent
Kang et al.

(10) Patent No.: US 9,116,876 B2
(45) Date of Patent: Aug. 25, 2015

(54) PROGRAMMABLE BUILT-IN-SELF TESTER (BIST) IN MEMORY CONTROLLER

(71) Applicant: QUALCOMM Incorporated, San Diego, CA (US)

(72) Inventors: Woo Tag Kang, San Diego, CA (US); Roberto F. Averbuj, San Diego, CA (US); Manish Shah, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 219 days.

(21) Appl. No.: 13/718,014

(22) Filed: Dec. 18, 2012

(65) Prior Publication Data

US 2014/0173344 A1   Jun. 19, 2014

(51) Int. Cl.
*G06F 11/00* (2006.01)
*G06F 11/27* (2006.01)
*G11C 29/12* (2006.01)
*G11C 29/04* (2006.01)

(52) U.S. Cl.
CPC ............ *G06F 11/27* (2013.01); *G11C 29/1201* (2013.01); *G11C 2029/0401* (2013.01)

(58) Field of Classification Search
CPC ....... G06F 11/27; G06F 11/22; G06F 11/273; G06F 11/2733; G06F 11/277
USPC ............ 714/30, 25, 27, 33, 37, 40, 42, 45, 54
See application file for complete search history.

(56) References Cited

U.S. PATENT DOCUMENTS

| | | | |
|---|---|---|---|
| 6,067,262 A | 5/2000 | Irrinki et al. | |
| 6,226,764 B1 | 5/2001 | Lee | |
| 6,370,661 B1 | 4/2002 | Miner | |
| 6,668,347 B1 | 12/2003 | Babella et al. | |
| 6,671,837 B1 | 12/2003 | Reohr, Jr. et al. | |
| 6,728,910 B1 | 4/2004 | Huang | |
| 6,769,081 B1 * | 7/2004 | Parulkar | 714/733 |
| 6,959,256 B2 * | 10/2005 | Basto | 714/42 |
| 7,254,762 B2 | 8/2007 | Anzou et al. | |
| 7,475,315 B1 | 1/2009 | Natarajan et al. | |
| 7,751,266 B2 | 7/2010 | Adams et al. | |
| 2002/0199136 A1 * | 12/2002 | Ku | 714/30 |
| 2005/0066247 A1 * | 3/2005 | Cheng et al. | 714/733 |
| 2005/0257109 A1 | 11/2005 | Averbuj et al. | |

(Continued)

OTHER PUBLICATIONS

Nourani, et al., "A Bypass Scheme for Core-Based System Fault Testing", Proceedings Design Automation and Test in Europe, 1998, pp. 979-980.

(Continued)

*Primary Examiner* — Joseph D Manoskey
(74) *Attorney, Agent, or Firm* — Donald D. Min (57) ABSTRACT

Some novel features pertain to a memory controller that includes a memory controller logic, a built-in-self-tester (BIST) logic, and a switch. The memory controller logic is for controlling memory on a memory die. The built-in-self tester (BIST) logic is for testing the memory. The switch is coupled to the BIST logic and the memory. In some implementations, the BIST logic bypasses the memory controller logic when testing the memory by accessing the memory through the switch. The switch may be controlled by the BIST logic. In some implementations, the switch is coupled to the memory controller logic. The switch may control data to the memory that is transmitted from the memory controller logic and the BIST logic based on priority of the data.

28 Claims, 7 Drawing Sheets

(56) References Cited

U.S. PATENT DOCUMENTS

| | | |
|---|---|---|
| 2007/0011538 A1* | 1/2007 | Chen .............................. 714/733 |
| 2007/0177425 A1 | 8/2007 | Gorman et al. |
| 2010/0223512 A1* | 9/2010 | Resnick ........................ 714/718 |
| 2012/0092943 A1 | 4/2012 | Nishioka |
| 2014/0043918 A1* | 2/2014 | Ellis et al. ................ 365/189.02 |
| 2014/0164833 A1* | 6/2014 | Kobla et al. .................... 714/30 |

OTHER PUBLICATIONS

International Search Report and Written Opinion—PCT/US2013/076042—ISA/EPO—Jun. 11, 2014.

* cited by examiner

PROGRAMMABLE BUILT-IN-SELF TESTER (BIST) IN MEMORY CONTROLLER

BACKGROUND

1. Field

Various features relate to a programmable built-in-self-tester in a memory controller.

2. Background

Figure 1:
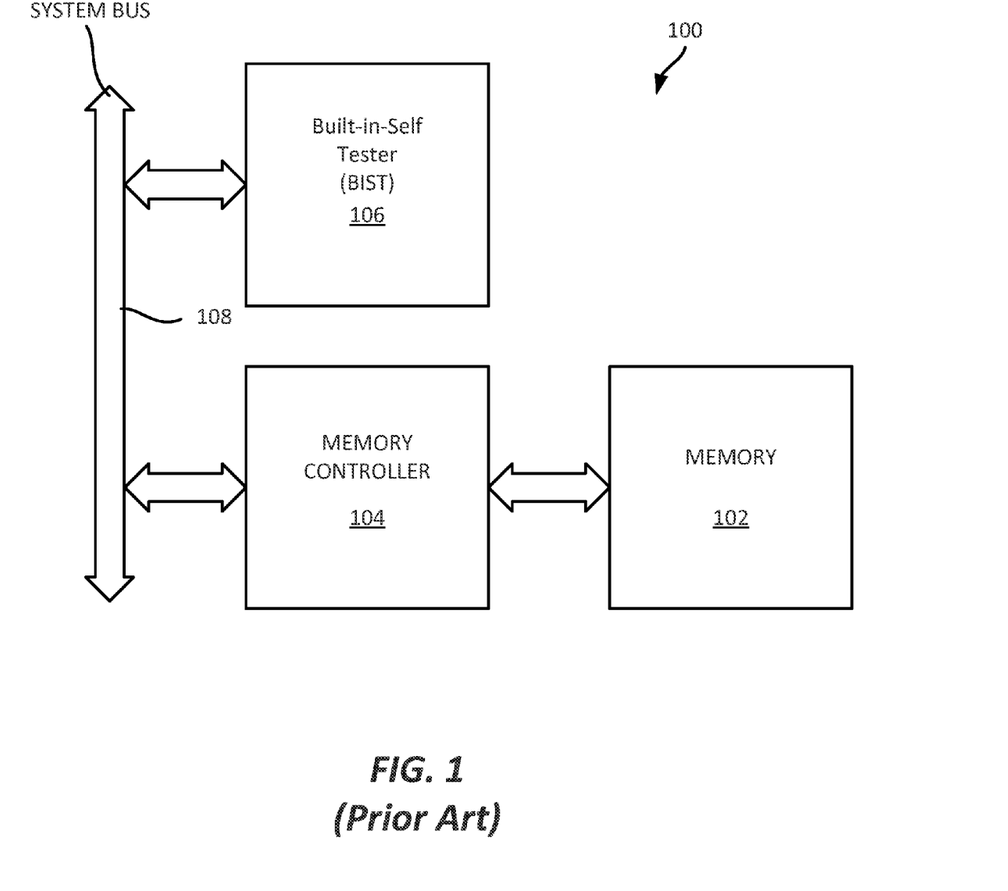
FIG. 1 illustrates a built-in-self tester for a memory.

A package with a built-in-self tester (BIST) is a package that is capable of testing itself. That is, the package can perform self-diagnosis tests to check the operation and/or functionality of the package. FIG. 1 illustrates a conventional memory package 100 with a built-in-self tester. For purposes of clarity, not all components are shown. As shown in FIG. 1, the memory package 100 includes a memory 102, a memory controller 104, a built-in-self tester (BIST) 106 and a system bus 108. The memory controller 104 is coupled to the memory 102. The memory controller 104 controls the read and write operations of the memory 102. The BIST 106 is coupled to the memory controller 104 through the system bus 108. In order for the BIST 106 to perform testing operations on the memory 102, the BIST 106 must communicate with and send the instructions to the memory controller 104 through the system bus 108. These instructions are then sent by the memory controller 104 to the memory 102. Any data from the memory 102 is received by the memory controller 104, which then provides the data to the BIST 106 through the system bus 108.

There are several disadvantages to this conventional memory BIST configuration. First, this configuration makes it impossible to know the cause of any failure in the test performed by the BIST 106. That is, in this configuration, the BIST 106 is unable to determine whether the failure of the test is because of the memory 102 or the memory controller 104. This is the case because the BIST 106 is communicating with the memory controller 104 and not directly with the memory 102. Thus, the memory 102 could be working properly, but there could be failures with the memory controller 104.

Second, this configuration is limited by the capabilities of the memory controller 104. Since the memory controller 104 acts as an intermediate between the BIST 106 and the memory 102, any operation performed on the memory 102 is limited by the capabilities of the memory controller 104, even if the BIST 106 is capable of performing other operations and/or functionalities. For instances, if the memory controller 104 is capable of performing only one type of scan (e.g., scan A) and the BIST 106 is capable of performing a variety of scans (e.g., scan A, scan B, etc. . . . ), the only scan that can be performed by the BIST 106 on the memory 102 is the one that the memory controller 104 can perform (e.g., scan A).

Third, this configuration is also limited by the capabilities of the system bus 108. The system bus 108 operates on a set of different protocols than the protocols of the memory controller 104. These differences can cause inefficiencies in the testing process.

Therefore, there is a need for an improved memory BIST that is capable of testing memory without being restricted by the limitations of a memory controller and, or system bus. Ideally, the memory BIST is programmable to perform a variety of tests.

SUMMARY

Various features, apparatus and methods described herein provide a programmable built-in-self-tester (BIST) in a memory controller.

A first example provides a memory controller that includes a memory controller logic, a built-in-self-tester (BIST) logic, and a switch. The memory controller logic is for controlling memory on a memory die. The built-in-self tester (BIST) logic is for testing the memory. The switch is coupled to the BIST logic and the memory. In some implementations, the BIST logic bypasses the memory controller logic when testing the memory by accessing the memory through the switch.

According to one aspect, the switch is controlled by the BIST logic. In some implementations, the switch is coupled to the memory controller logic. The switch may control data to the memory that is transmitted from the memory controller logic and the BIST logic based on priority of the data.

According to another aspect, the memory controller may further include a memory interface that coupled to the memory. In some implementations, the switch is part of the memory interface. The memory controller logic may control the memory through the switch and the memory interface. In some implementations, the BIST logic may test the memory through the switch and the memory interface.

According to yet another aspect, the BIST logic may operate independently of the memory controller logic when testing the memory. In some implementations, the BIST logic is programmable to perform a plurality of scans on the memory.

According to one aspect, the memory controller is integrated of a first die that is different than the memory die. In some implementations, the memory die is positioned above the first die that includes the memory controller. In some implementations, the memory controller logic is for controlling memory on several memory dice. The BIST logic for testing memory on several memory dice. The memory dice may be positioned above the first die that includes the memory controller. In some implementations, the memory dice may be positioned next to the first die. The first die and the memory dice may be located in a package (e.g., System-in-Package (SiP)) in some implementations.

A second example provides a method for testing a memory in a memory die. The method provides data, by a built-in-self tester (BIST) logic to the memory via a switch in a memory controller, bypassing a memory controller logic of the memory controller. The method receives data, at the BIST logic from the memory via the switch, bypassing the memory controller logic. The method determines whether the received data matches an expected data to determine whether the memory is functional or faulty.

According to one aspect, the method may specify the memory as functional when the received data matches the expected data. In some implementations, the expected data is the data that was provided by the BIST logic to the memory via the switch. In some implementations, the method may specify the memory as faulty when the received data does not match the expected data. The data may be provided to the memory through a memory interface of the memory controller. In addition, the switch may be part of the memory interface.

According to another aspect, the method provide a control signal, by the BIST logic to the switch, to instruct the switch to send data from the BIST logic to the memory. In some implementations, the method may select a scan to be performed on the memory from several scans. In such instances, providing data may include providing data based on the selected scan. In some implementations, the method is operational on a memory controller that is integrated in a first die that is different than a memory die. The memory die may be positioned above the first die that includes the memory controller. The first die and the memory die may be located in a package in some implementations.

A third example provides a computer readable storage medium that includes one or more instructions for testing a memory in a memory die. The one or more instructions which when executed by at least one processor, causes the at least one processor to provide data, by a built-in-self tester (BIST) logic to the memory via a switch in a memory controller, bypassing a memory controller logic of the memory controller. The one or more instructions which when executed by at least one processor, causes the at least one processor to further receive data, at the BIST logic from the memory via the switch, bypassing the memory controller logic. The one or more instructions which when executed by at least one processor, causes the at least one processor to also determine whether the received data matches an expected data to determine whether the memory is functional or faulty.

According to one aspect, the data is provided to the memory through a memory interface of the memory controller. In some implementations, the switch is part of the memory interface.

According to another aspect, The one or more instructions which when executed by the at least one processor, causes the at least one processor to also provide a control signal, by the BIST logic to the switch, to instruct the switch to send data from the BIST logic to the memory. In some implementations, the one or more instructions, which when executed by the at least one processor, causes the at least one processor to also select a scan to be performed on the memory from several scans.

A fourth example provides an apparatus for testing a memory in a memory die. The apparatus includes means for providing data, by a built-in-self tester (BIST) logic to the memory via a switch in a memory controller, bypassing a memory controller logic of the memory controller. The apparatus also includes means for receiving data, at the BIST logic from the memory via the switch, bypassing the memory controller logic. The apparatus includes means for determining whether the received data matches an expected data to determine whether the memory is functional or faulty.

According to one aspect, the data is provided to the memory through a memory interface of the memory controller. In some implementations, the switch is part of the memory interface.

According to another aspect, the apparatus also includes means for providing a control signal, by the BIST logic to the switch, to instruct the switch to send data from the BIST logic to the memory.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Several novel features pertain to a memory controller that includes a memory controller logic for controlling memory on a memory die. The memory controller also includes a built-in-self tester (BIST) logic for testing the memory. The memory controller further includes a switch coupled to the BIST logic and the memory. The BIST logic bypasses the memory controller logic when testing the memory by accessing the memory through the switch. The memory controller may also include a memory interface for coupling with the memory. The switch may be part of the memory interface in some implementations. The memory controller may be part of a die that is separate from the memory die. In some embodiments, the BIST logic may be capable of performing several different scans on the memory to determine whether the memory/memory die is functional or faulty. In addition, the BIST logic may be capable of identifying which part(s) of the memory/memory die is faulty.

Exemplary Built-in-Self Tester (BIST) in a Memory Controller

Figure 2:
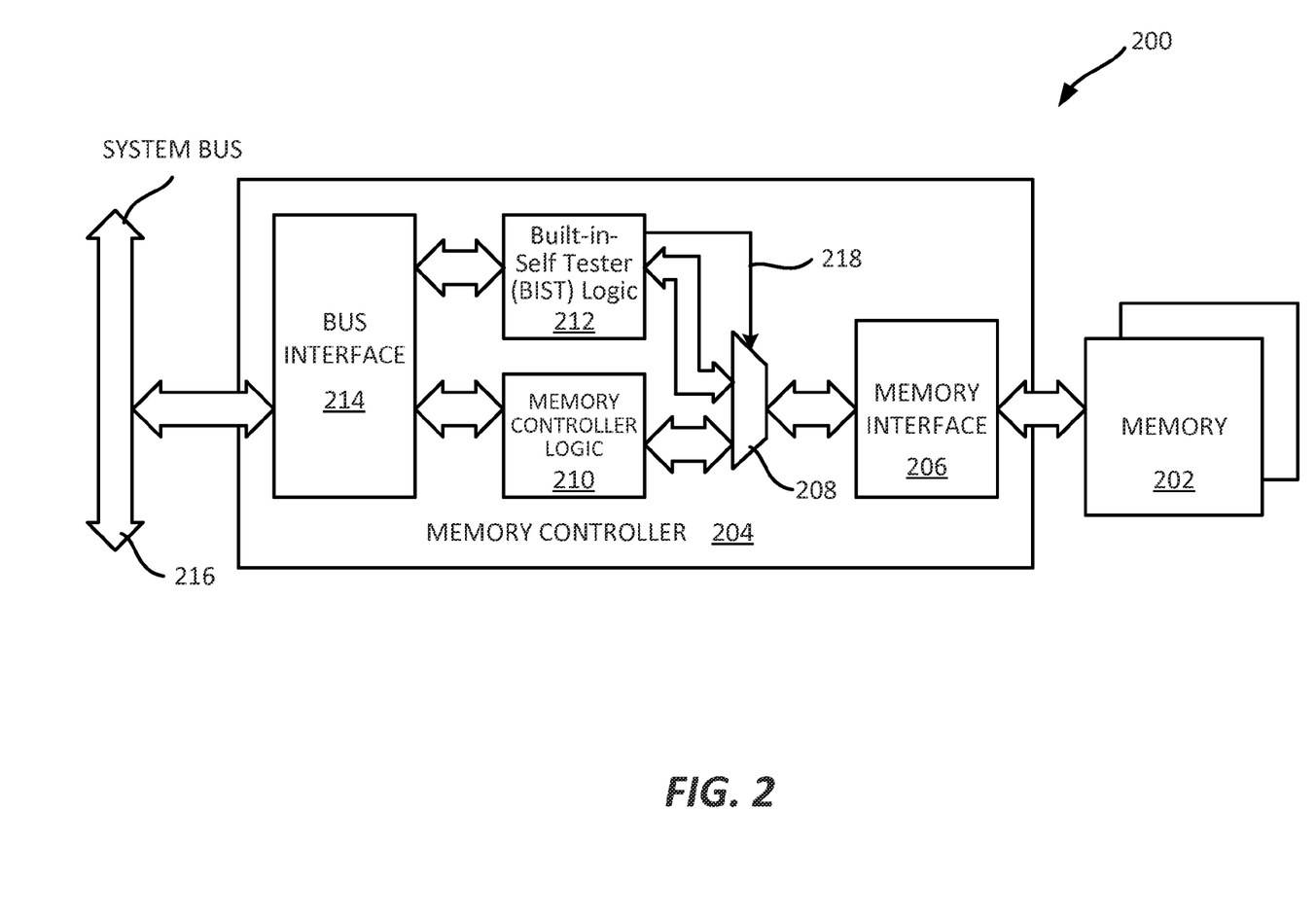
FIG. 2 illustrates a novel built-in-self tester for a memory.

FIG. 2 illustrates a configuration 200 with a memory BIST of some implementations. The configuration 200 may be part of a System-in-Package (SiP) in some embodiments. As shown in FIG. 2, the configuration includes a memory 202 and a memory controller 204. The memory 202 may be a single memory module or it may be an array of memory modules. The memory 202 may be one or more dice, where each die has one or more memory modules. The memory 202 may be any type of memory. In some implementations, the memory 202 is a Double Data Rate Synchronous Dynamic Random Access Memory (DDR SDRAM).

The memory controller 204 includes a memory interface 206, a switch 208, a memory controller logic 210, a built-in-self tester (BIST) logic 212, and a bus interface 214. The bus interface 214 is coupled to a system bus 216. In some implementations, the memory controller 204 is part of a die. The memory controller die may be separate from the memory 202 and/or a die that includes the memory 202.

The memory interface 206 is coupled to the memory 202. The memory interface 206 may include input/output (I/O) pins that connect to corresponding I/O pins (not shown) on the memory 202. For example, when the memory controller 204 is part of a die and the memory 202 is part of another die, the memory interface 206 may be coupled to the memory 202 by through silicon vias (TSVs), wire bonding, and/or solder bumps.

The switch 208 is coupled to the memory interface 206, the memory controller logic 210 and the BIST logic 212. The switch 208 may receive input from multiple sources (e.g., memory controller logic 210, BIST logic 212) and provide selective output to one destination (e.g., memory interface 206). In addition, the switch 208 may receive input from one source (e.g., memory interface 206) and provide output to some or all of the destinations from the several possible destinations (e.g., memory controller logic 210, BIST logic 212). In some implementations, the switch 208 may be a multiplexer. The switch 208 may include several switches. For example, the switch 208 may represent/include a first switch and a second switch. Each switch may be controlled by one or more control signals (e.g., control signal 218) from the BIST logic 212 in some implementations. The first switch may be used to control flow of instructions/data in a first direction (e.g., from BIST logic to memory), while a second switch may be used to control flow of instructions/data in a second direction (e.g., from memory to BIST logic) that is different from the first direction. The operation of the switch 208 will be further described in detail below.

The memory controller logic 210 may perform control operations on the memory 202 through the memory interface 206. For example, the memory controller logic 210 may perform read and write operations on the memory 202. These read and write operations may specify the location of the memory 202 where data is written to and/or where data is read from.

The BIST logic 212 may perform test on the memory 202 through the memory interface 206. The BIST logic 212 may perform a variety of testing operations (e.g., using different testing algorithms and/or scans). These testing operations or scans may be selectable and/or programmable. In some implementations, the BIST logic 212 may be programmable (e.g., program the types of tests that the BIST logic can perform) through an interface (e.g. Joint Test Action Group (JTAG) interface). Moreover, the BIST logic may be a separate circuit from the circuit of the memory controller logic of the memory controller, in some implementations.

Having described various components of the memory controller 204, a more detailed description of the switch 208 will now be described. As shown in FIG. 2, the communication between the memory controller logic 210 and memory interface 206 goes through the switch 208. Similarly, the communication between the BIST logic 212 and the memory interface 206 goes through the switch 208.

In some implementations, the switch 208 is controlled by the BIST logic 212 through a control signal 218. The control signal 218 instructs the switch 208 which data from either the memory controller logic 210 or the BIST logic 212 has priority and/or should be forwarded to the memory interface 206. Thus, the switch 208 in essence directs and controls the flow of instructions/data to and from the memory interface 206. Consequently, since the memory 202 is coupled to the memory interface 206, the switch 208 directs and controls the flow of instructions/data to and from the memory 202. The flow of instructions/data may be assigned based on priority. For example, in some implementations, instructions/data from the BIST logic 212 may have higher priority than instructions/data from the memory controller logic 210.

Since the BIST logic 212 provides the control signal 218 to the switch 208, the BIST logic 212 essentially controls the switch 208. Thus, the BIST logic 212 may control how the memory 202 is tested without being restricted by any limitations of the memory controller logic 210. In essence, even though the BIST logic 212 is part of the memory controller 204, the BIST logic 212 is bypassing the memory controller logic 210. In some implementations, the BIST logic 212 may operate independently from the memory controller logic 210. In addition, because the BIST logic 212 is part of the memory controller 204, the BIST logic 212 is also bypassing the system bus 216. Thus, the BIST logic 212 is also free from the inefficiencies of the system bus 216. In addition, keeping the BIST logic 212 separate from the memory controller logic 210 allows the memory controller to be able to test a memory (e.g., bare memory die) even if the memory controller logic is defective.

FIG. 2 shows that all communications to and from the memory interface 206 goes through switch 208. This may be possible when the switch 208 includes a multiplexer and a demultiplexer. However, in some implementations, the switch 208 may be unidirectional and may only receive communication (e.g., instructions, data) to the memory interface 206. In such instances, when the memory interface 206 sends communications to the memory controller logic 210 and/or the BIST logic 212, the memory interface 206 may bypass the switch 208 and send the communication (e.g., instructions, data) directly to the memory controller logic 210 and/or the BIST logic 212. In some implementations, the BIST logic 212 may also receive data through the memory controller logic 210.

Figure 3:
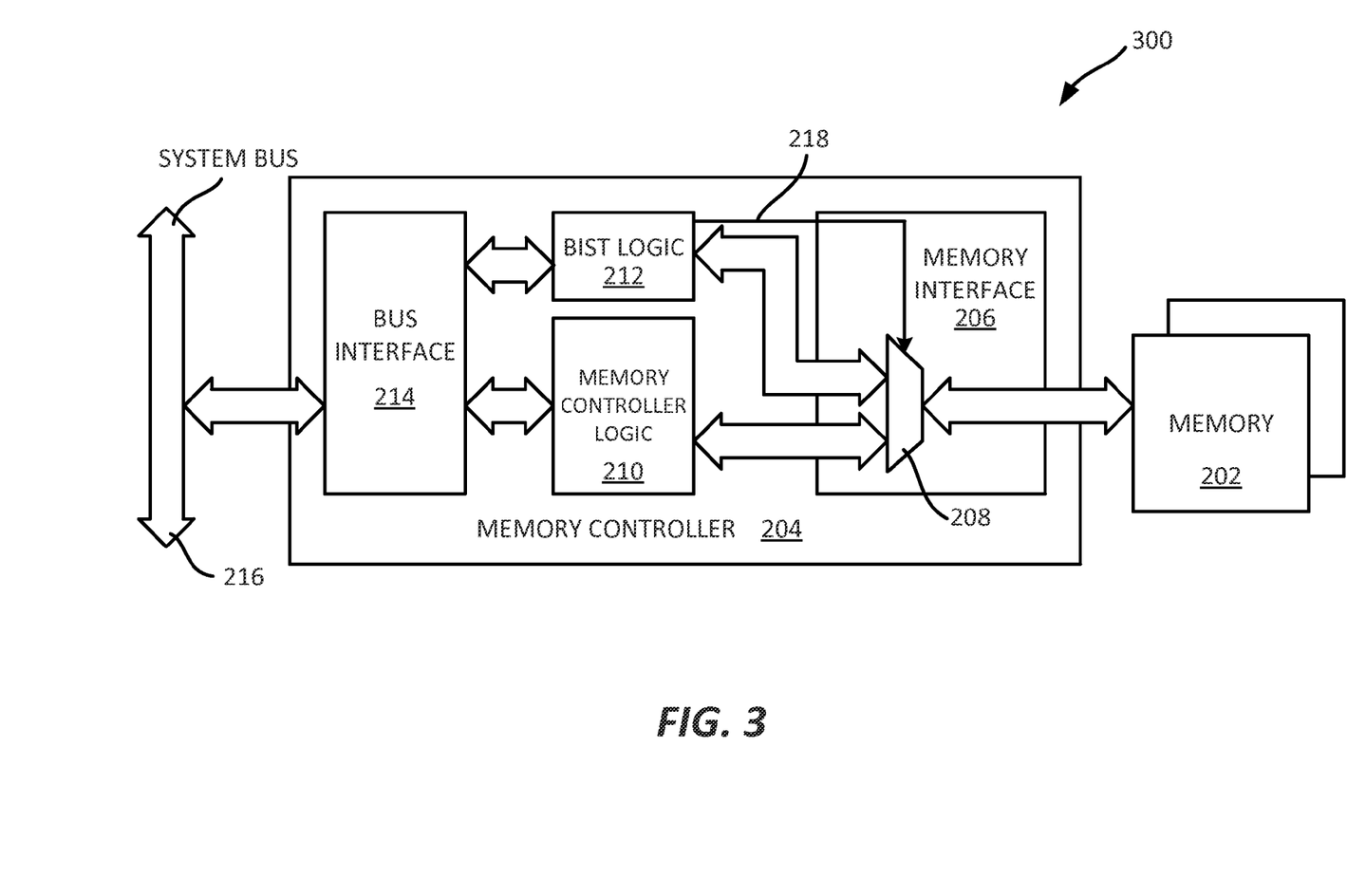
FIG. 3 illustrates another novel built-in-self tester for a memory.

FIG. 2 also illustrates that the switch 208 is separate from the memory interface 206. However, the switch 208 may be part of the memory interface 206 in some implementations. FIG. 3 illustrates a switch that is part of a memory interface. FIG. 3 is similar to FIG. 2, except that the switch 208 is part of the memory interface 206.

As described above, the memory 202 may be part of a memory die. In addition, the memory controller 204 may be part of a memory controller die in some implementations. These dice may be part of a package, such as a System-in-Package (SiP). An example of a SiP with memory controller with a BIST logic is further described below with reference to FIG. 5.

Having described a memory controller with a BIST for testing a memory, an exemplary method for testing a memory die will now be described below.

Exemplary Method for Testing a Memory Die

Figure 4:
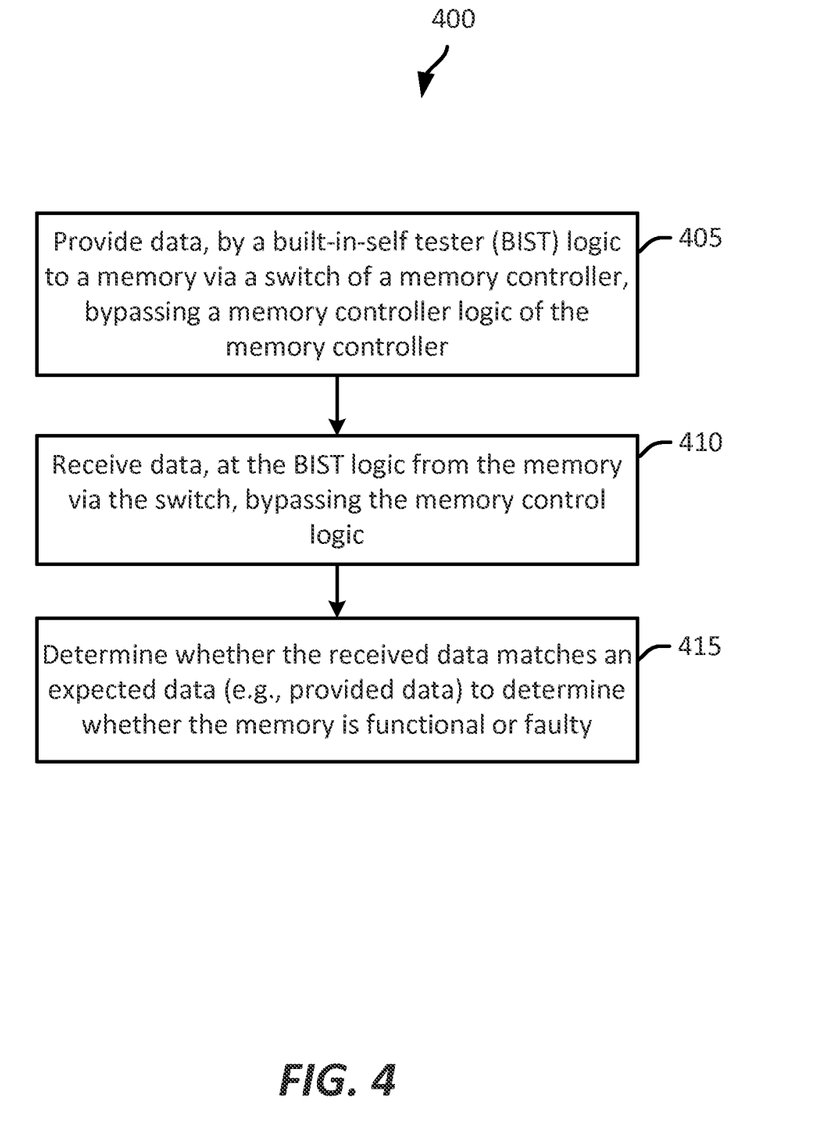
FIG. 4 illustrates a flow diagram of a method for testing a memory die using a built-in-self tester.

FIG. 4 illustrates a general overview flow diagram of a method for testing a memory. In some implementations, the method of FIG. 4 is performed by a built-in-self tester (BIST) logic that is part of a memory controller but separate from the memory controller logic of the memory controller. That is, the BIST logic may be a separate circuit from the circuit of the memory controller logic of the memory controller, in some implementations. In some implementations, the method of FIG. 4 may be performed even if the memory controller logic of the memory controller is defective.

The method starts by providing (at 405) data to a memory via a switch, which bypasses the memory controller logic of a memory controller. The data is provided by the BIST logic in some implementations. The memory may be a memory die (e.g., bare memory die) that is separate to another die that includes the memory controller. The switch may be controllable by the BIST logic through one or more control signals. In some embodiments, the switch controls the flow of data to and from the memory. That is, the switch may control what data is written to the memory or what data is read from the memory, as well where the read data from the memory is sent. As such, in some implementations, providing (at 405) data may also include sending a control signal to the switch. The control signal may specify the switch to assign a higher priority to communication/data coming from the BIST logic. Alternatively, or in addition, the control signal may specify the switch to only allow communication/data from the BIST logic to be sent to the memory. When data is provided (at 405) to the memory, the data may include data that is to be written to some portion or all of the memory.

The data that is provided to the memory may be based on the type of scan that is going to be performed on the memory. As described above, some implementations of the BIST logic may be capable of performing a variety of scans. In such instances, the method of FIG. 4 may select a scan from several possible scans before providing the data to the memory. Moreover, the data that is provided to the memory may be based on the scan that is selected.

Next, the method receives (at 410) data from the memory via the switch, bypassing the memory controller logic. In some implementations, the data that is received (at 410) is data that was read from some portion or all of the memory. The data that was read may include data that was previously provided (at 405) and written to the memory.

After receiving (at 410) the data, the method determines (at 415) whether the received data matches an expected data to determine whether the memory is functional or faulty. The expected data may be the data that was provided (at 405) in some implementations. In such instances, the method determines (at 415) whether the received data (at 410) from the memory matches the data that was provided (at 405) to the memory.

If the method determines (at 415) there is a match, the method may determine that the memory or memory die is functional and ends. That is, the method may determine (at 415) that the memory or memory die is working properly.

However, if the method determines (at 415) there is at least one data that doesn't match, then the method may determine that the memory or memory die is faulty and ends. In some embodiments, when the memory or memory die is faulty, the memory, memory die or the package that includes the memory or memory die may be discarded.

In some implementations, determining that a memory or memory die is faulty may also include identifying which part of the memory or memory die is faulty. This may be useful to identify possible manufacturing defects that occur in the same part of the memory die. Such defects may be relayed back to the manufacturer which may make appropriate manufacturing adjustments to avoid further faults and/or defects in the memory or memory die.

In some embodiments, a memory or memory die may still be considered functional even if not all the data match. That is, some implementations may require that there be a certain threshold number of mismatch in the data before the memory is considered faulty. This certain number may be represented as a percentage of total data, or if data from a certain portion of the memory does not match. Thus, a method may allow a certain tolerance in defects and/or faults in the memory or memory die when determining whether a memory or memory die is functional or faulty/defective.

Having described a method for testing a memory die by using a memory controller that includes a BIST logic, a package that includes a memory controller with a BIST logic will now be described below.

Exemplary Package with Memory Controller Having BIST Logic

Figure 5:
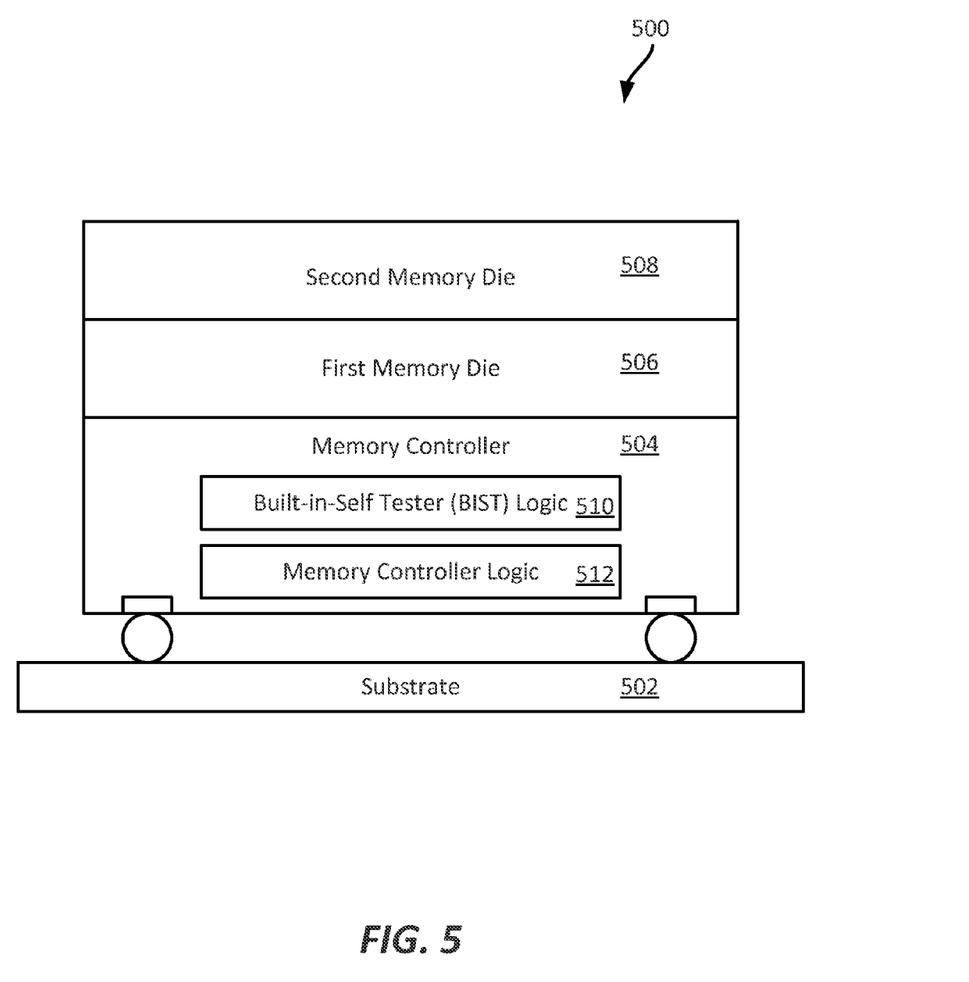
FIG. 5 illustrates a memory package with a built-in-self tester.

FIG. 5 illustrates how a memory controller that includes a BIST logic for testing a memory may be implemented in a package (e.g., SiP). Specifically. FIG. 5 illustrates a package 500 that includes a substrate 502, a memory controller die 504, a first memory die 506 and a second memory die 508. The memory controller die 504 is located on top of the substrate 502. The memory controller die 504 may include a BIST logic 510 and a memory controller logic 512. The first memory die 506 is located on top of the memory controller die 504. The second memory die 508 is located on top of the first memory die 508. The first and second memory dice 506-508 may also be located to the side of the memory controller die 504 in a package. The first memory die 506 and/or the second memory die 508 may be a DDR SDRAM in some implementations.

The memory controller die 504 is for controlling the first and second memory dice 506-508. In some implementations, the control is performed by the memory controller logic 512. The BIST logic 510 is for testing the first memory die 506 and/or the second memory die 508.

The BIST logic 510 may be defined by one or more circuits in the memory controller die 504. Similarly, the memory controller logic 512 may be defined by a one or more circuits in the memory controller die 504. In some implementations, the one or more circuits that define the BIST logic 510 may be positioned in the memory controller die 504 such that they are closer to a memory die (e.g., first memory die 506) than the one or more circuits that define the memory controller logic 512. Placing the one or more circuits that define the BIST logic 510 close to the memory die (or at least close to a memory interface of the memory controller die) shortens the path that the data has to travel thereby reducing the likelihood that defects in the memory controller die 504 will affect the results of any tests being performed by the BIST logic 510.

Although only two memory dice are shown, the package 500 may include more than two memory dice. In addition, the position of the dice may be located differently. For example, the memory controller die 504 may be located between the first memory die 506 and the second memory die 508. The memory controller 504 may also be located on top of the second memory die 508 in some implementations. The dice in the package 500 may be electrically connected to each other by through silicon vias (TSVs), wire bonding and/or solder bumps in some implementations.

Having described various components of a package that includes a memory controller with a BIST logic for testing a memory, an exemplary method for manufacturing a package that includes a memory controller with a BIST logic for testing a memory die will now be described below.

Figure 6:
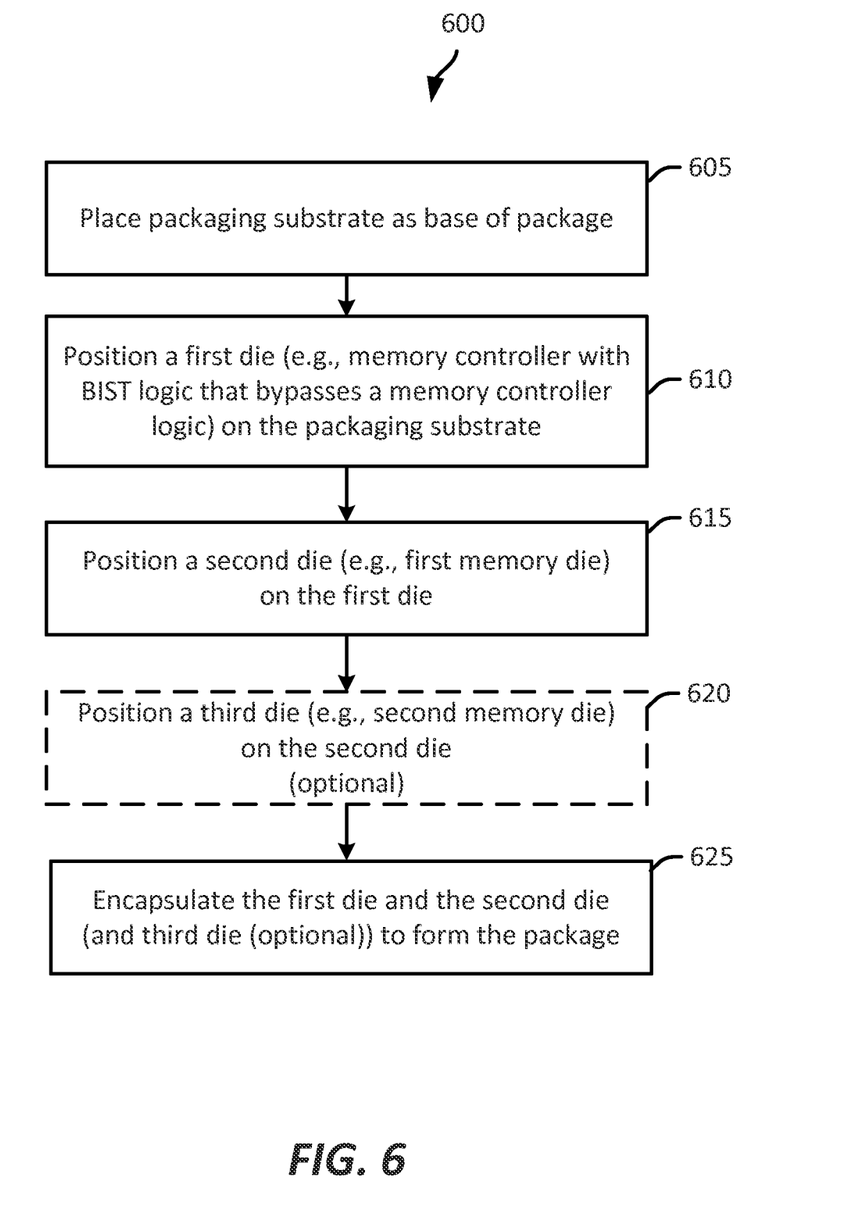
FIG. 6 illustrates a flow diagram of a method for manufacturing a memory package with a built-in-self tester.

Exemplary Method for Manufacturing a Package with a Memory Controller Having a BIST Logic FIG. 6 illustrates a method 600 for manufacturing a package that includes a memory controller that includes a built-in-self tester (BIST) logic for testing a memory die in the package. The method begins by placing (at 605) a packaging substrate to create the base of the package. The packaging substrate may be a semiconductor substrate or a glass substrate. Next, the method positions (at 610) a first die on the packaging substrate. In some implementations, the first die may be a memory controller which is coupled to the packaging substrate by through silicon vias (TSVs). The memory controller may include a memory controller logic and a built-in-self tester (BIST) logic that bypasses the memory controller logic when testing a memory (e.g., memory die). The memory controller may also include a switch that allows the BIST logic to bypass the memory controller logic when testing a memory.

Once the first die has been positioned (at 610), the method positions (at 615) a second die on top of the first die. In some implementations, the second die is coupled to the first die by TSVs. The second die may be a memory die (e.g., Double Data Rate Synchronous Dynamic Random Access Memory (DDR SDRAM))

Next, the method may optionally position (at 620) a third die on top of the second die. The third die may also be another memory die. In some implementations, the third die is coupled to the second die by TSVs.

After the first die and the second die (and optionally the third die) have been positioned within the package, the first die and the second die (and optionally the third die) are encapsulated (at 625) by putting a cap, which creates the package (e.g., System-in-Package (SiP)) and the method ends. Different bonding processes (e.g., thermal compression bonding, reflow bonding) may be used to couple the dice to the substrate. In some implementations, more than two or three dice are positioned within the package.

Figure 7:
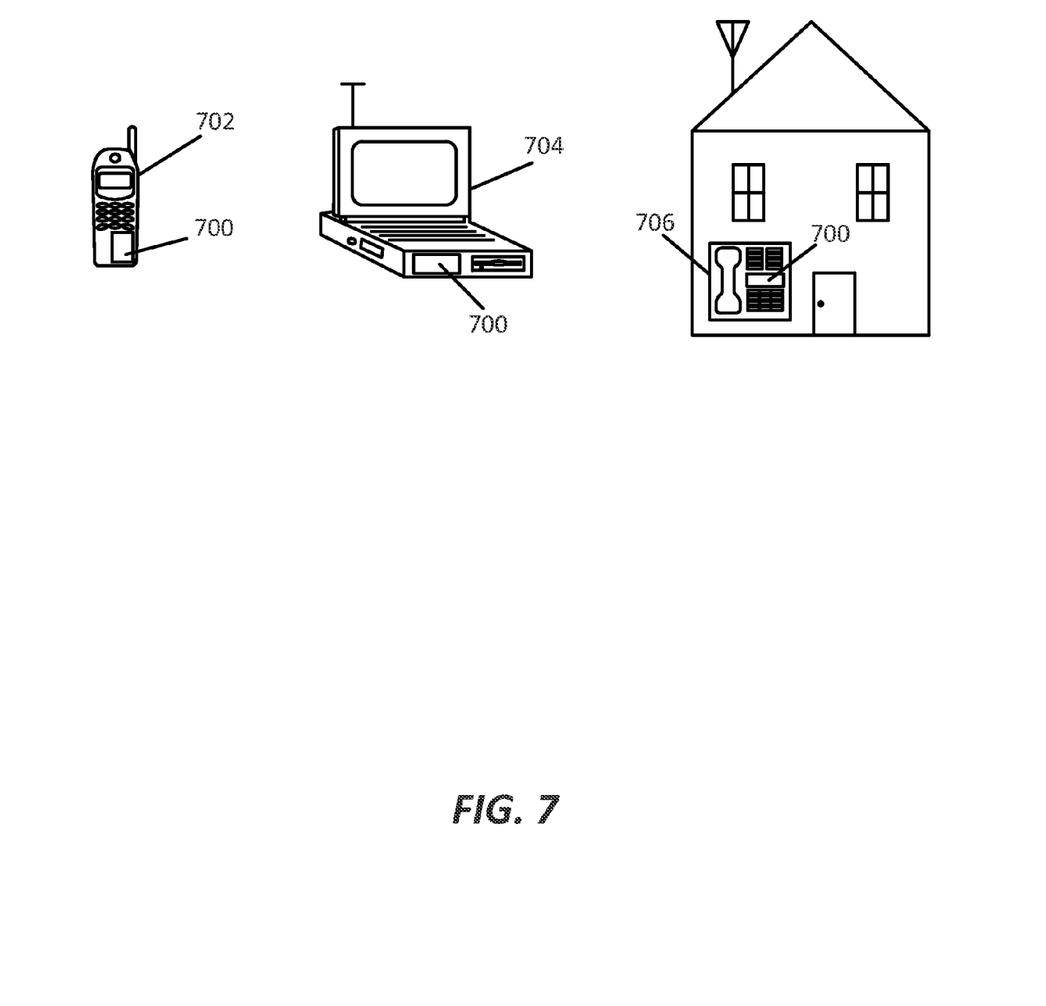
FIG. 7 illustrates various electronic devices that may integrate the IC described herein.

FIG. 7 illustrates various electronic devices that may be integrated with any of the aforementioned integrated circuit, die, chip or package. For example, a mobile telephone 702, a laptop computer 704, and a fixed location terminal 706 may include an integrated circuit (IC) 700. The IC 700 may be, for example, any of the integrated circuits, dice or packages described herein. The devices 702, 704, 706 illustrated in FIG. 7 are merely exemplary. Other electronic devices may also feature the IC 700 including, but not limited to, handheld personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof.

One or more of the components, steps, features, and/or functions illustrated in FIGS. 2, 3, 4, 5, 6 and/or 7 may be rearranged and/or combined into a single component, step, feature or function or embodied in several components, steps, or functions. Additional elements, components, steps, and/or functions may also be added without departing from the invention.

One or more of the components, steps, features and/or functions illustrated in the FIGs may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGs may be configured to perform one or more of the methods, features, or steps described in the FIGs. The novel algorithms described herein may also be efficiently implemented in software and/or embedded in hardware.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another— even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine readable mediums for storing information. The terms "machine readable medium" or "machine readable storage medium" include, but are not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits (e.g., processing circuit), elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory. EEPROM memory, registers, hard disk, a removable disk, a CD-ROM, or any other form of storage medium known in the art. A storage medium may be coupled to the processor such that the processor can read information from, and write information to the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A memory controller comprising:
   a memory controller logic for controlling memory on a memory die, where the memory controller logic is located within the memory controller on a first die that is different than the memory die;
   a built-in-self tester (BIST) logic located within the memory controller on the first die for testing the memory; and
   a switch coupled to the BIST logic and to the memory via a memory interface, wherein the BIST logic bypasses the memory controller logic when testing the memory by accessing the memory through the switch, the switch being controlled by a control signal from the BIST logic.

2. The memory controller of claim 1, wherein the switch is coupled to the memory controller logic, the switch controlling data to the memory that is transmitted from the memory controller logic and the BIST logic based on priority of the data.

3. The memory controller of claim 1, further comprising a memory interface coupled to the memory, wherein the switch is part of the memory interface, the memory controller logic controlling the memory through the switch and the memory interface, the BIST logic testing the memory through the switch and the memory interface.

4. The memory controller of claim 1, wherein the BIST logic operates independently of the memory controller logic when testing the memory.

5. The memory controller of claim 1, wherein the BIST logic is programmable to perform a plurality of scans on the memory.

6. The memory controller of claim 5, wherein the BIST logic is programmable through a Joint Test Action Group (JTAG) interface.

7. The memory controller of claim 1, wherein the BIST logic comprises a capability to perform a plurality of scans on the memory.

8. The memory controller of claim 1, wherein the memory die is a bare memory die.

9. The memory controller of claim 1, wherein the switch is coupled to the BIST logic and to the memory via a memory interface within the memory controller.

10. A method for testing a memory in a memory die, comprising:
    providing data, by a built-in-self tester (BIST) logic to the memory via a switch in a memory controller, bypassing a memory controller logic of the memory controller, where the memory controller logic and the BIST logic are located within the memory controller on a first die that is different than the memory die, and the switch is controlled by a control signal from the BIST logic;
    receiving data, at the BIST logic from the memory via the switch, bypassing the memory controller logic; and
    determining whether the received data matches an expected data to determine whether the memory is functional or faulty.

11. The method of claim 10, further comprising specifying the memory as functional when the received data matches the expected data.

12. The method of claim 11, wherein the expected data is the data that was provided by the BIST logic to the memory via the switch.

13. The method of claim 10, further comprising specifying the memory as faulty when the received data does not match the expected data.

14. The method of claim 10, wherein the data is provided to the memory through a memory interface of the memory controller.

15. The method of claim 14, wherein the switch is part of the memory interface.

16. The method of claim 10, further comprising providing a control signal, by the BIST logic to the switch, to instruct the switch to send data from the BIST logic to the memory.

17. The method of claim 10, further comprising selecting a scan to be performed on the memory from a plurality of scans, wherein providing data comprises providing data based on the selected scan.

18. The method of claim 10, wherein the memory die is a bare memory die.

19. A non-transitory computer readable storage medium comprising one or more instructions for testing a memory in a memory die, which when executed by at least one processor, causes the at least one processor to:
    provide data, by a built-in-self tester (BIST) logic to the memory via a switch in a memory controller, bypassing a memory controller logic of the memory controller, where the memory controller logic and the BIST logic are located within the memory controller on a first die that is different than the memory die, and the switch is controlled by a control signal from the BIST logic;
    receive data, at the BIST logic from the memory via the switch, bypassing the memory controller logic; and
    determine whether the received data matches an expected data to determine whether the memory is functional or faulty.

20. The non-transitory computer readable storage medium of claim 19, wherein the data is provided to the memory through a memory interface of the memory controller.

21. The non-transitory computer readable storage medium of claim 20, wherein the switch is part of the memory interface.

22. The non-transitory computer readable storage medium of claim 19, further comprising one or more instructions, which when executed by the at least one processor, causes the at least one processor to provide a control signal, by the BIST logic to the switch, to instruct the switch to send data from the BIST logic to the memory.

23. The non-transitory computer readable storage medium of claim 19, further comprising one or more instructions, which when executed by the at least one processor, causes the at least one processor to select a scan to be performed on the memory from a plurality of scans, wherein the one or more instructions, which when executed by the at least one processor, causes the at least one processor to provide data comprises one or more instructions, which when executed by the at least one processor, causes the at least one processor to provide data based on the selected scan.

24. An apparatus for testing a memory in a memory die, comprising:
    means for providing data, by a built-in-self tester (BIST) logic to the memory via a switch in a memory controller, bypassing a memory controller logic of the memory controller, where the memory controller logic and the BIST logic are located within the memory controller on a first die that is different than the memory die, and the switch is controlled by a control signal from the BIST logic;

means for receiving data, at the BIST logic from the memory via the switch, bypassing the memory controller logic; and means for determining whether the received data matches an expected data to determine whether the memory is functional or faulty.

25. The apparatus of claim 24, wherein the data is provided to the memory through a memory interface of the memory controller.

26. The apparatus of claim 25, wherein the switch is part of the memory interface.

27. The apparatus of claim 24, further means for providing a control signal, by the BIST logic to the switch, to instruct the switch to send data from the BIST logic to the memory.

28. The apparatus of claim 24, further comprising means for selecting a scan to be performed on the memory from a plurality of scans, wherein means for providing data comprises means for providing data based on the selected scan.

* * * * *